(12) United States Patent
Chen

(10) Patent No.: US 8,194,491 B2
(45) Date of Patent: Jun. 5, 2012

(54) POWER-UP CIRCUIT

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 330 days.

(21) Appl. No.: 12/728,508

(22) Filed: Mar. 22, 2010

(65) Prior Publication Data

US 2011/0228623 A1 Sep. 22, 2011

(51) Int. Cl.
*G11C 5/14* (2006.01)

(52) U.S. Cl. ........ 365/228; 365/226; 365/229; 365/194; 327/538; 327/540; 327/543

(58) Field of Classification Search .................. 365/226, 365/228, 229
See application file for complete search history.

(56) References Cited

U.S. PATENT DOCUMENTS

| | | | | |
|---|---|---|---|---|
| 5,319,601 A * | 6/1994 | Kawata et al. | ................. | 365/226 |
| 5,345,422 A | 9/1994 | Redwine | | |
| 6,097,659 A * | 8/2000 | Kang | ............................ | 365/226 |
| 6,657,903 B2 * | 12/2003 | Sung | ........................ | 365/189.09 |
| 6,735,142 B1 * | 5/2004 | Oh | ................................. | 365/227 |
| 6,937,074 B2 * | 8/2005 | Shin | ............................. | 327/143 |
| 7,106,112 B2 * | 9/2006 | Jang | ............................. | 327/143 |
| 7,212,046 B2 * | 5/2007 | Hur | ............................... | 327/143 |
| 7,436,226 B2 * | 10/2008 | Kim | ............................... | 327/143 |
| 7,521,988 B2 * | 4/2009 | Shin | .............................. | 327/536 |
| 7,679,412 B2 * | 3/2010 | Ogiwara et al. | ............. | 327/143 |
| 7,852,129 B2 * | 12/2010 | Do | .................................. | 327/143 |
| 7,965,573 B2 * | 6/2011 | Byeon | .......................... | 365/226 |
| 7,969,212 B2 * | 6/2011 | Rho | .............................. | 327/143 |

* cited by examiner

*Primary Examiner* — Viet Q Nguyen
(74) *Attorney, Agent, or Firm* — WPAT, P.C.; Anthony King (57) ABSTRACT

A power-up circuit comprises an external supply voltage potential detector, a first internal supply voltage potential detector, a second internal supply voltage potential detector, and a logic circuit. The external supply voltage potential detector is configured to detect a supply voltage that is external to the memory device and to generate a first detection signal indicating whether a voltage potential of the external supply voltage reaches a first predetermined value. The first internal supply voltage potential detector is configured to detect a first internal supply voltage that is internal to the memory device and to generate a second detection signal indicating whether a voltage potential of the first internal supply voltage reaches a second predetermined value. The second internal supply voltage potential detector is configured to detect a second internal supply voltage that is internal to the memory device and to receive the first detection signal and an output voltage of the first internal supply voltage potential detector for generating a third detection signal indicating whether the voltage potentials of the external supply voltage and the first and second internal supply voltages reach the first, second, and third predetermined values respectively. The logic circuit is configured to receive the third detection signal and to generate a power-up signal.

18 Claims, 6 Drawing Sheets

POWER-UP CIRCUIT

BACKGROUND OF THE INVENTION

1. Field of the Invention

The present invention relates to a power-up circuit, and more particularly, to a power-up circuit for a semiconductor memory device.

2. Description of the Related Art

Power-up circuits are often included in integrated circuit chips for providing a power-up pulse that initializes the different portions of the circuit when a supply voltage is applied to the chip. For example, in a computer system, many electronic devices in the system, such as a memory device, need to be driven to an initial condition prior to being used after the computer system is turned on or reset. A typical memory device has memory cells which use a variety of logic circuits such as latches and flip-flops to support their operation. These logic circuits need to be driven to an initial condition before the memory device is used to store data. As such, a power-up circuit is used to ensure that the logic circuits are initialized without floating gate nodes that could lead to excessive power consumption or unknown states.

A typical design of a power-up circuit is a resistor-capacitor (RC) time delay circuit connected to an input of an inverter. When a supply voltage is first applied to the delay circuit, the capacitor starts to charge. Upon starting the charging process, the inverter outputs a signal at a logic high level. When the capacitor is sufficiently charged to generate a logic high level, the output of the inverter switches to a logic low level. The time interval between the logic high and logic low levels of the output of the inverter defines a power-up pulse for driving the logic circuits in the integrated chip. Although the conventional RC time delay circuit is generally suitable to provide a power-up signal, it is problematic in the case of a slow-rising supply voltage. When the supply voltage ramps up relatively slowly compared with the charging rate of the capacitor, the power-up pulse may not be generated, and power-up failure will occur.

Figure 1:
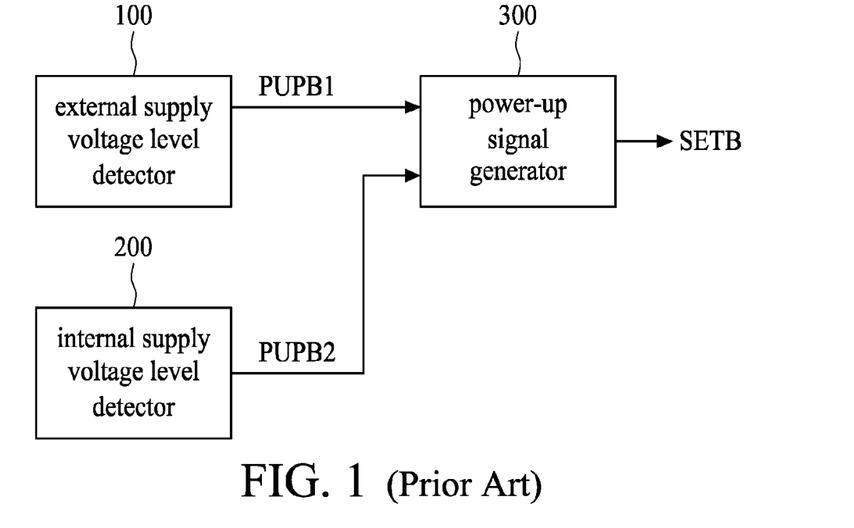
FIG. 1 shows a power-up circuit disclosed in U.S. Pat. No. 6,097,659.

FIG. 1 shows a power-up circuit disclosed in U.S. Pat. No. 6,097,659. The power-up circuit includes an external supply voltage level detector 100, an internal supply voltage level detector 200, and a power-up signal generator 300. The detector 100 is configured for detecting an external supply voltage level and generating a detection signal PUPB1 when a first predetermined voltage level is detected. The detector 200 is configured for detecting an internal supply voltage level and generating a detection signal PUPB2 when a second predetermined voltage level is detected. The power-up signal generator 300 is configured for receiving the detection signals PUPB1, PUPB2 and generating a power-up signal SETB. Because the detection signals PUPB1, PUPB2 are independent from each other, this circuit may have a problem with various supply voltage rising sequences.

Accordingly, there is a need to provide a power-up circuit that can set the initial condition correctly. The power-up circuit should also have the ability to adjust trigger points of voltage potentials of supply voltages so that a power-up signal can be maintained long enough to ensure that logic circuits in a memory device are driven to initial conditions adequately.

SUMMARY OF THE INVENTION

An aspect of the present invention is to provide a power-up circuit, and more particularly, to provide a power-up circuit for a semiconductor memory device.

According to one embodiment of the present invention, the power-up circuit comprises an external supply voltage potential detector, a first internal supply voltage potential detector, a second internal supply voltage potential detector, and a logic circuit. The external supply voltage potential detector is configured to detect a supply voltage that is external to the memory device and to generate a first detection signal indicating whether a voltage potential of the external supply voltage reaches a first predetermined value. The first internal supply voltage potential detector is configured to detect a first internal supply voltage that is internal to the memory device and to generate a second detection signal indicating whether a voltage potential of the first internal supply voltage reaches a second predetermined value. The second internal supply voltage potential detector is configured to detect a second internal supply voltage that is internal to the memory device and to receive the first detection signal and an output voltage of the first internal supply voltage potential detector for generating a third detection signal indicating whether the voltage potentials of the external supply voltage and the first and second internal supply voltages reach the first, second, and third predetermined values respectively. The logic circuit is configured to receive the third detection signal and to generate a power-up signal.

BRIEF DESCRIPTION OF THE DRAWINGS

The invention will be described according to the appended drawings in which.

DETAILED DESCRIPTION OF THE INVENTION

Figure 2:
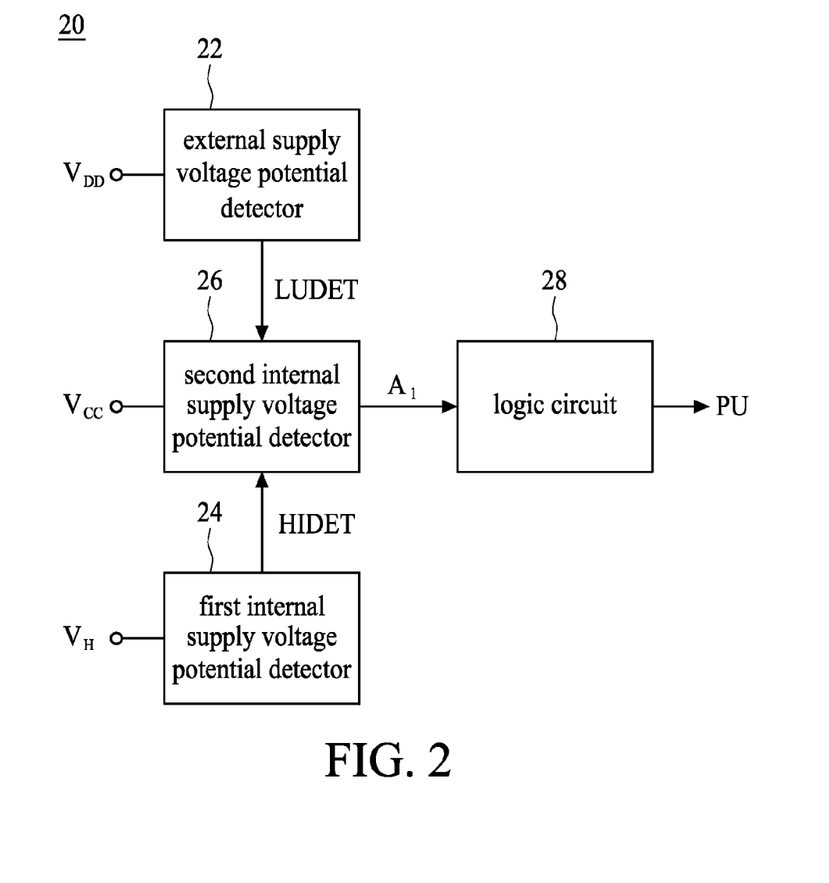
FIG. 2 shows a block diagram of a power-up circuit for a semiconductor memory device according to one embodiment of the present invention.

FIG. 2 shows a block diagram of a power-up circuit 20 for a semiconductor memory device according to one embodiment of the present invention. The power-up circuit 20 comprises an external supply voltage potential detector 22, a first internal supply voltage potential detector 24, a second internal supply voltage potential detector 26, and a logic circuit 28. Referring to FIG. 2, the external supply voltage potential detector 22 is configured to detect an external supply voltage $V_{DD}$ that is external to the memory device (not shown) and to generate a detection signal LUDET, and the first internal supply voltage potential detector 24 is configured to detect an internal supply voltage $V_H$ that is internal to the memory device and to generate a second detection signal.

The second internal supply voltage potential detector 26 is configured to detect an internal supply voltage $V_{CC}$ that is internal to the memory device and to receive the detection signal LUDET and an output voltage of the voltage potential detector 24 HIDET for generating a detection signal $A_1$, and the logic circuit 28 is configured to receive the detection signal $A_1$ and to generate a power-up signal PU. The voltage potential of the supply voltage $V_H$ is different from that of the supply voltage $V_{CC}$, and the supply voltage $V_{CC}$ usually has a lower voltage potential compared to the external supply voltage $V_{DD}$. In one embodiment, the supply voltage $V_H$ is provided for directly driving the word line in the memory device and thus it has a voltage potential higher than that of the supply voltage $V_{CC}$.

Figure 3:
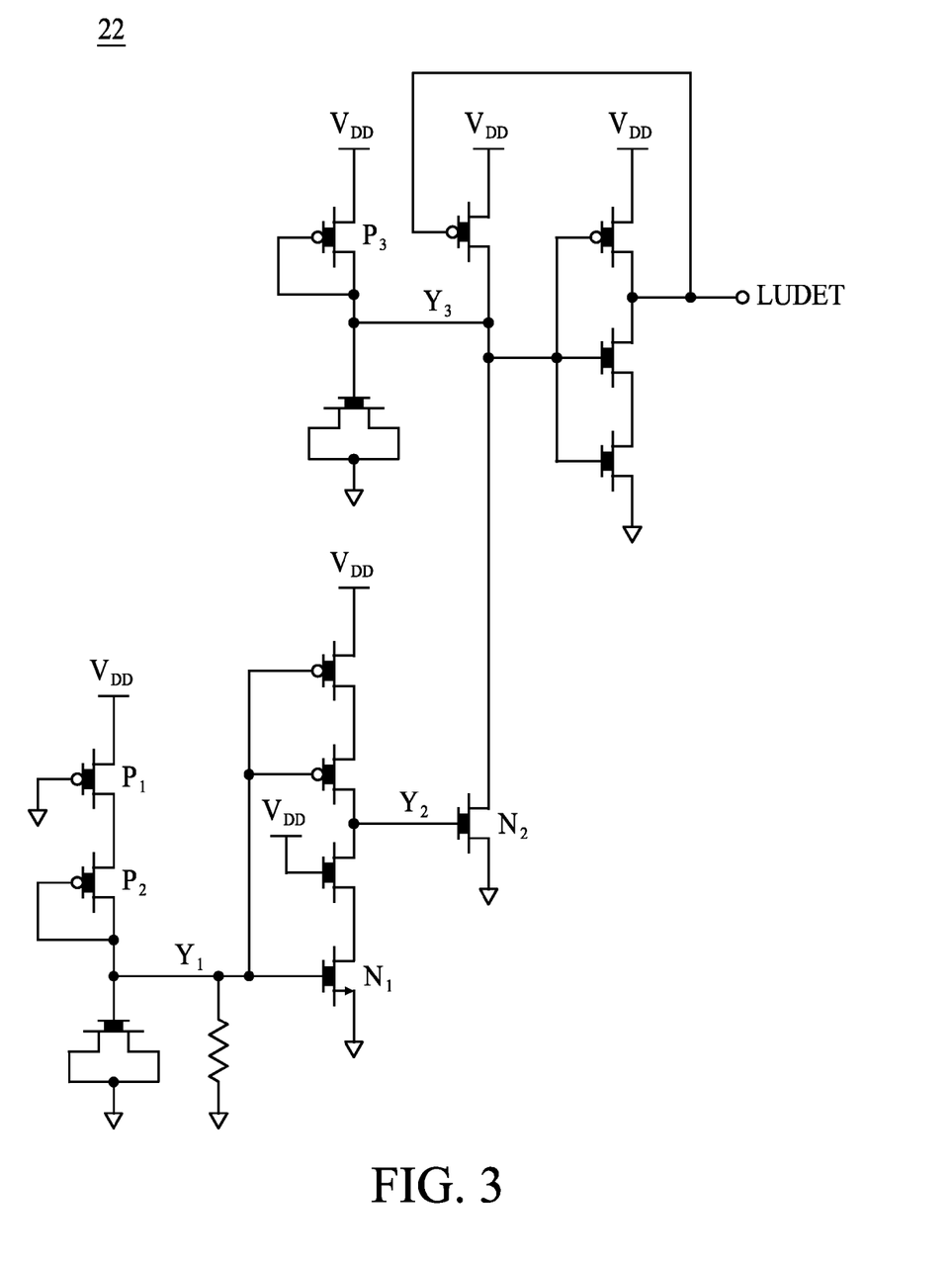
FIG. 3 shows a detailed block diagram in accordance with one embodiment of the external supply voltage potential detector in FIG. 2.

FIG. 3 shows a detailed block diagram in accordance with one embodiment of the external supply voltage potential detector 22 in FIG. 2. The voltage potential detector 22 is configured to generate the detection signal LUDET indicating whether the voltage potential of the external supply voltage $V_{DD}$ reaches a predetermined value. Referring to FIG. 3, the voltage potential detector 22 comprises thick oxide PMOS transistors $P_1$, $P_2$, $P_3$ and thick oxide NMOS transistors $N_1$, $N_2$. The PMOS transistor $P_1$ has a gate connected to a reference voltage GND, a source connected to the external supply voltage $V_{DD}$, and a drain connected to the PMOS transistor $P_2$, and the PMOS transistor $P_2$ has a gate that is shorted to its drain. The NMOS transistor $N_1$ has a gate connected to the PMOS transistor $P_2$ and a source connected to the reference voltage GND.

Figure 4:
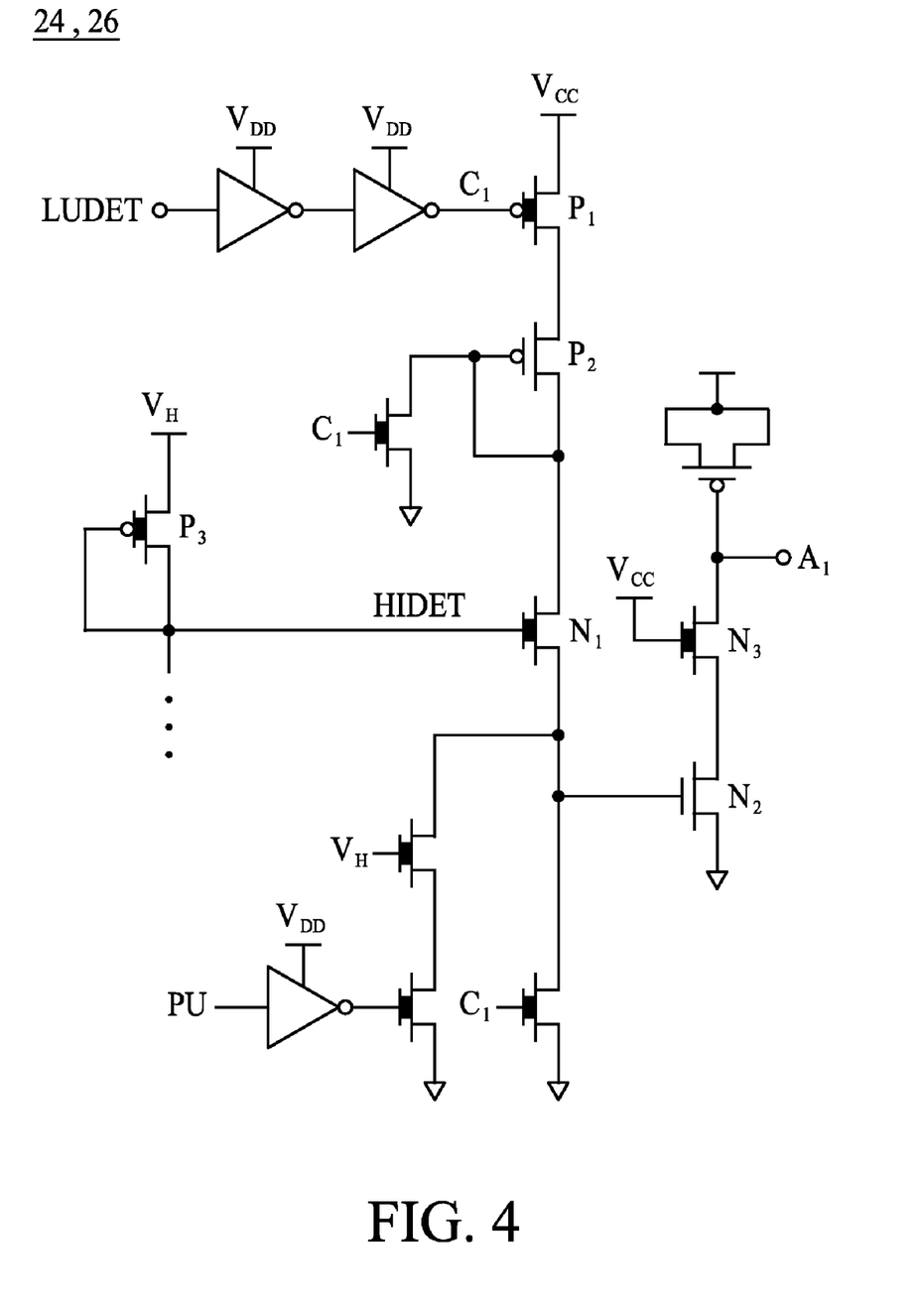
FIG. 4 shows a detailed block diagram in accordance with one embodiment of the first and second internal supply voltage potential detectors in FIG. 2.

FIG. 4 shows a detailed block diagram in accordance with one embodiment of the first and second internal supply voltage potential detectors 24 and 26 in FIG. 2. The first internal supply voltage potential detector 24 is configured to generate the detection signal indicating whether the voltage potential of the internal supply voltage $V_H$ reaches a predetermined value. Referring to FIG. 4, the voltage potential detector 24 comprises a thick oxide PMOS transistor $P_3$, a thick oxide NMOS transistor $N_1$, and a thin oxide NMOS transistor $N_2$. The PMOS transistor $P_3$ has a source connected to the supply voltage $V_H$, a gate shorted to its drain, and a drain connected to the NMOS transistor $N_1$, while the NMOS transistor $N_1$ has a source connected to a gate of the NMOS transistor $N_2$.

Referring to FIG. 4, the voltage potential detector 26 comprises a thick oxide PMOS transistor $P_1$, a thin oxide PMOS transistor $P_2$, the thick oxide NMOS transistor $N_1$, and the thin oxide NMOS transistor $N_2$. The PMOS transistor $P_1$ has a source connected to the supply voltage $V_{CC}$, a gate configured to receive the detection signal LUDET, and a drain connected to a source of the PMOS transistor $P_2$. The PMOS transistor $P_2$ has a gate that is shorted to its drain, and the drain is connected to the NMOS transistor $N_1$. In addition, in order to protect the drain of the NMOS transistor $N_2$ from the higher voltage potential of the external supply voltage $V_{DD}$, a thick oxide NMOS transistor $N_3$ is added to the drain of the NMOS transistor $N_2$. The NMOS transistor $N_3$ has a gate connected to the supply voltage $V_{CC}$, a drain connected to the detection signal $A_1$, and a source connected to the drain of the NMOS transistor $N_2$.

Figure 5:
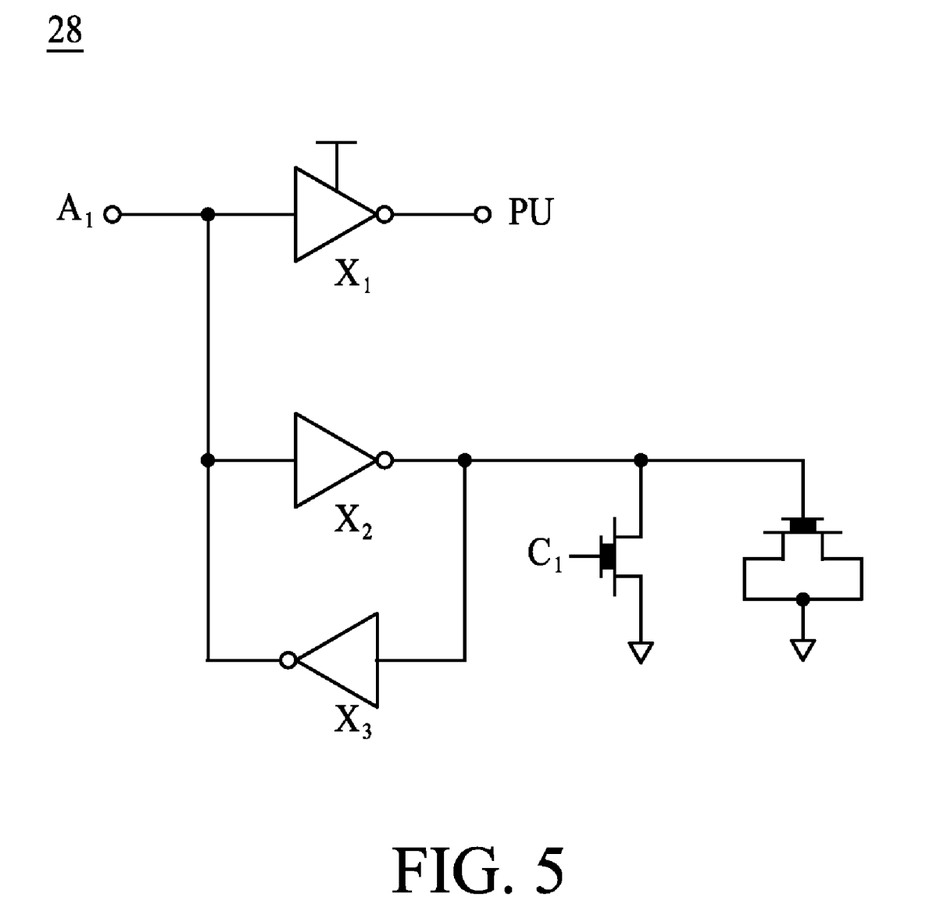
FIG. 5 shows a detailed block diagram in accordance with one embodiment of the logic circuit in FIG. 2.

FIG. 5 shows a detailed block diagram in accordance with one embodiment of the logic circuit 28 in FIG. 2. The logic circuit 28 is configured to receive the detection signal $A_1$ and to generate the power-up signal PU. Referring to FIG. 5, the logic circuit 28 comprises an inverter $X_1$ and a latch unit composed of inverters $X_2$ and $X_3$. When the voltage potentials of the supply voltages $V_{DD}$, $V_{CC}$, and $V_H$ all reach the corresponding predetermined values, the power-up PU signal is activated.

The operation of the power-up circuit 20 is now described in further detail in accordance with FIGS. 2-5. Referring to FIG. 3, when the external supply voltage $V_{DD}$ has risen to the predetermined value equal to the sum of the threshold voltage of the PMOS transistor $P_2$ and the threshold voltage of the NMOS transistor $N_1$, a node voltage $Y_2$ is pulled down to a logic low level and thus the NMOS transistor $N_2$ is turned off. In this case, a node voltage $Y_3$ has risen to a voltage potential equal to the supply voltage $V_{DD}$ minus the threshold voltage of the PMOS transistor $P_3$. As a result, a node voltage LUDET is pulled down to a logic low level.

Referring to FIG. 4, when the node voltage LUDET is pulled down to the logic low level, the PMOS transistor $P_1$ is turned on and thus the supply voltage $V_{CC}$ passes through the PMOS transistor $P_1$. Meanwhile, when the supply voltage $V_H$ has risen to the predetermined value equal to a sum of the threshold voltage of the PMOS transistor $P_3$, the threshold voltage of the NMOS transistor $N_1$, and the threshold voltage of the NMOS transistor $N_2$, the NMOS transistor $N_2$ has the possibility to be turned on. In this case, when the internal supply voltage $V_{CC}$ has risen to the predetermined value equal to the sum of the threshold voltage of the PMOS transistor $P_2$ and the threshold voltage of the NMOS transistor $N_2$, the NMOS transistor $N_2$ is turned on, so that the node voltage $A_1$ is pulled down to a logic low level. As such, the node voltage $A_1$ at the logic low level is transmitted to the logic circuit 28 and the power-up signal PU is activated.

Figure 6:
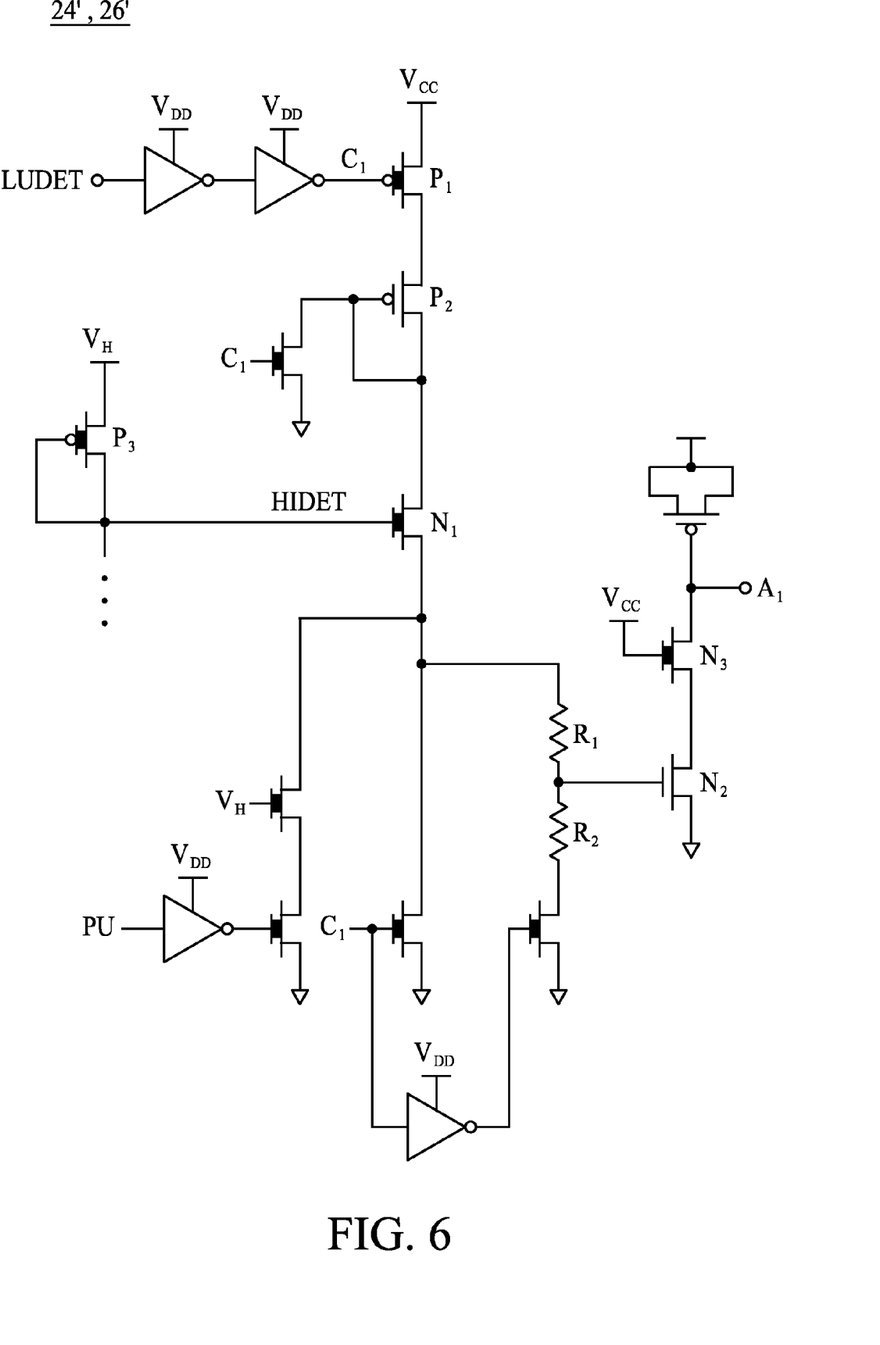
FIG. 6 shows a block diagram of the modified voltage potential detectors according to one embodiment of the present invention.

In addition, in order to adjust the predetermined values representing the trigger points of the supply voltages $V_{CC}$ and $V_H$, one or more circuits can be added to the voltage potential detectors 24 and 26. FIG. 6 shows a block diagram of the modified voltage potential detectors 24' and 26' according to one embodiment of the present invention. In contrast to the configuration shown in FIG. 4, additional resistors $R_1$ and $R_2$ are added between the source of the NMOS transistor $N_1$ and the reference voltage GND for adjusting the trigger point of the NMOS transistor $N_2$, wherein the gate of the NMOS transistor $N_2$ is connected to a connection point between the resistors $R_1$ and $R_2$. In this case, the internal supply voltages $V_{CC}$ and $V_H$ need to be raised to a higher voltage potential so as to turn on the NMOS transistor N2. Therefore, the power-up signal PU can be maintained long enough to ensure that logic circuits in the memory device are driven to initial conditions adequately. In addition, a similar configuration can be applied in FIG. 3, that is, an additional resistor is added between the drain of the PMOS transistor $P_2$ and the gate of the NMOS transistor $N_1$. Using such voltage division resistors, the predetermined value representing the trigger points of the supply voltages $V_{DD}$ can be adjusted.

Figure 7:
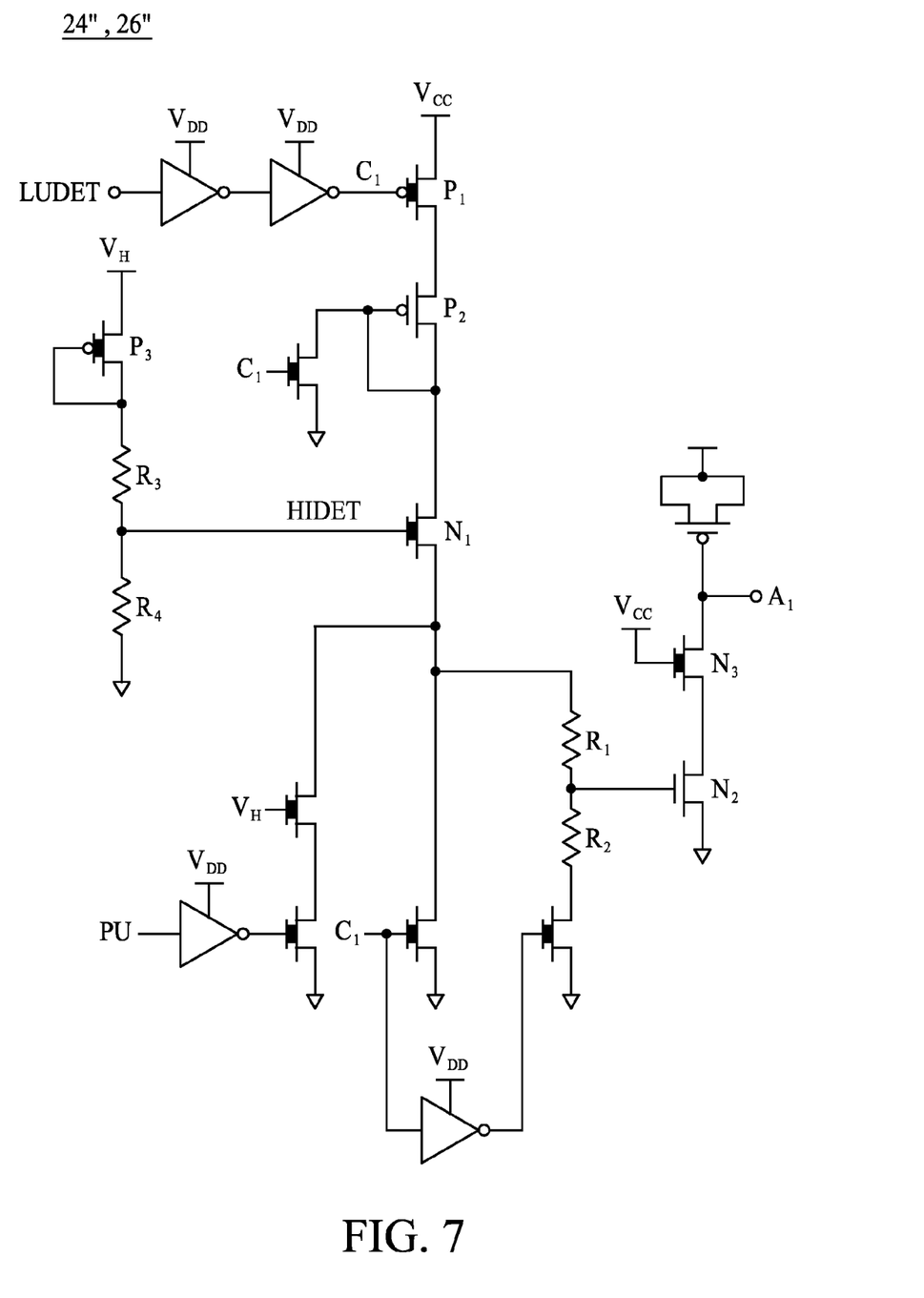
FIG. 7 shows a block diagram of the modified voltage potential detectors according to one embodiment of the present invention.

Furthermore, FIG. 7 shows a block diagram of the modified voltage potential detectors 24" and 26" according to one embodiment of the present invention. In contrast to the configuration shown in FIG. 6, additional resistors $R_3$ and $R_4$ are added between the drain of the PMOS transistor $P_3$ and the reference voltage GND for adjusting the trigger point of the NMOS transistor $N_1$, wherein the gate of the NMOS transistor $N_1$ is connected to a connection point between the resistors $R_3$ and $R_4$. Using such voltage division resistors, a detection level of the supply voltage $V_H$ can be adjusted.

The above-described embodiments of the present invention are intended to be illustrative only. Numerous alternative embodiments may be devised by those skilled in the art without departing from the scope of the following claims.

What is claimed is:

1. A power-up circuit for a semiconductor memory device, comprising:
   an external supply voltage potential detector configured to detect a supply voltage that is external to the memory device and to generate a first detection signal indicating whether a voltage potential of the external supply voltage reaches a first predetermined value;

a first internal supply voltage potential detector configured to detect a first internal supply voltage that is internal to the memory device and to generate a second detection signal indicating whether a voltage potential of the first internal supply voltage reaches a second predetermined value;

a second internal supply voltage potential detector configured to detect a second internal supply voltage that is internal to the memory device and to receive the first detection signal and an output voltage of the first internal supply voltage potential detector for generating a third detection signal indicating whether the voltage potentials of the external supply voltage and the first and second internal supply voltages reach the first, second, and third predetermined values respectively; and a logic circuit configured to receive the third detection signal and to generate a power-up signal.

2. The power-up circuit of claim 1, wherein the first predetermined value is substantially equal to the sum of a threshold voltage of a thick oxide PMOS transistor and a threshold voltage of a thick oxide NMOS transistor.

3. The power-up circuit of claim 1, wherein the first predetermined value is substantially equal to a sum of a threshold voltage of a thick oxide PMOS transistor and a multiple of a threshold voltage of a thick oxide NMOS transistor.

4. The power-up circuit of claim 1, wherein the external supply voltage potential detector comprises:
a first thick oxide PMOS transistor having a gate connected to a reference voltage, a source connected to the external supply voltage, and a drain connected to a second thick oxide PMOS transistor;
the second thick oxide PMOS transistor having a gate that is shorted to its drain; and
a thick oxide NMOS transistor having a gate connected to the second thick oxide PMOS transistor, and a source connected to the reference voltage.

5. The power-up circuit of claim 1, wherein the external supply voltage potential detector comprises:
a first thick oxide PMOS transistor having a gate connected to a reference voltage, a source connected to the external supply voltage, and a drain connected to a second thick oxide PMOS transistor;
the second thick oxide PMOS transistor having a gate that is shorted to its drain;
first and second resistors connected between the drain of the second thick oxide PMOS transistor and the reference voltage; and
a thick oxide NMOS transistor having a gate connected to a connection point between the first and second resistors, and a source connected to the reference voltage.

6. The power-up circuit of claim 1, wherein the second predetermined value is substantially equal to the sum of a threshold voltage of a thick oxide PMOS transistor, a threshold voltage of a thick oxide NMOS transistor, and a threshold voltage of a thin oxide NMOS transistor.

7. The power-up circuit of claim 1, wherein the second predetermined value is substantially equal to the sum of a threshold voltage of a thick oxide PMOS transistor, a threshold voltage of a thick oxide NMOS transistor, and a multiple of a threshold voltage of a thin oxide NMOS transistor.

8. The power-up circuit of claim 1, wherein the first internal supply voltage potential detector comprises:
a thick oxide PMOS transistor having a source connected to the first internal supply voltage and a gate that is shorted to its drain;
a first thick oxide NMOS transistor having a gate connected to the thick oxide PMOS transistor; and
a thin oxide NMOS transistor having a gate connected to the first thick oxide NMOS transistor and a source connected to a reference voltage.

9. The power-up circuit of claim 8, further comprising a second thick oxide NMOS transistor having a gate connected to the second internal supply voltage, a drain connected to the third detection signal, and a source connected to the drain of the thin oxide NMOS transistor.

10. The power-up circuit of claim 1, wherein the first internal supply voltage potential detector comprises:
a thick oxide PMOS transistor having a source connected to the first internal supply voltage and a gate that is shorted to its drain;
a first thick oxide NMOS transistor having a gate connected to the thick oxide PMOS transistor;
first and second resistors connected between the source of the first thick oxide NMOS transistor and a reference voltage; and
a thin oxide NMOS transistor having a gate connected to a connection point between the first and second resistors and a source connected to the reference voltage.

11. The power-up circuit of claim 10, further comprising a second thick oxide NMOS transistor having a gate connected to the second internal supply voltage, a drain connected to the third detection signal, and a source connected to the drain of the thin oxide NMOS transistor.

12. The power-up circuit of claim 1, wherein the third predetermined value is substantially equal to the sum of a threshold voltage of a thin oxide PMOS transistor and a threshold voltage of a thin oxide NMOS transistor.

13. The power-up circuit of claim 1, wherein the third predetermined value is substantially equal to the sum of a threshold voltage of a thin oxide PMOS transistor and a multiple of a threshold voltage of a thin oxide NMOS transistor.

14. The power-up circuit of claim 1, wherein the second internal supply voltage potential detector comprises:
a thick oxide PMOS transistor having a gate configured to receive the first detection signal and a source connected to the second internal supply voltage;
a thin oxide PMOS transistor having a source connected to the thick oxide PMOS transistor and a gate that is shorted to its drain;
a first thick oxide NMOS transistor having a gate configured to receive the output voltage of the first internal supply voltage potential detector and a drain connected to the thin oxide PMOS transistor; and
a thin oxide NMOS transistor having a gate connected to the first thick oxide NMOS transistor and a source connected to a reference voltage.

15. The power-up circuit of claim 14, further comprising a second thick oxide NMOS transistor having a gate connected to the second internal supply voltage, a drain connected to the third detection signal, and a source connected to the drain of the thin oxide NMOS transistor.

16. The power-up circuit of claim 1, wherein the second internal supply voltage potential detector comprises:
a thick oxide PMOS transistor having a gate configured to receive the first detection signal and a source connected to the second internal supply voltage;
a thin oxide PMOS transistor having a source connected to the thick oxide PMOS transistor and a gate that is shorted to its drain;
a first thick oxide NMOS transistor having a gate configured to receive the output voltage of the first internal supply voltage potential detector and a drain connected to the thin oxide PMOS transistor;

first and second resistors connected between the source of the first thick oxide NMOS transistor and a reference voltage; and a thin oxide NMOS transistor having a gate connected to a connection point between the first and second resistors and a source connected to the reference voltage.

17. The power-up circuit of claim 16, further comprising a second thick oxide NMOS transistor having a gate connected to the second internal supply voltage, a drain connected to the third detection signal, and a source connected to the drain of the thin oxide NMOS transistor.

18. The power-up circuit of claim 1, wherein the first internal supply voltage is provided for driving word lines in the memory device.

* * * * *